(12) United States Patent
Matsumoto et al.

(10) Patent No.: US 7,656,624 B2
(45) Date of Patent: Feb. 2, 2010

(54) IC POWER PROTECTION CIRCUIT

(75) Inventors: Masahiro Matsumoto, Hitachi (JP);
Masamichi Yamada, Hitachinaka (JP);
Hiroshi Nakano, Hitachi (JP); Keiji Hanzawa, Mito (JP); Ryo Sato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 322 days.

(21) Appl. No.: 11/656,994

(22) Filed: Jan. 24, 2007

(65) Prior Publication Data

US 2007/0211394 A1     Sep. 13, 2007

(30) Foreign Application Priority Data

Mar. 10, 2006   (JP)   ............... 2006-065654

(51) Int. Cl.
 *H02H 7/00*   (2006.01)
(52) U.S. Cl. .............. 361/18; 361/82; 361/84; 361/91.1; 361/91.5
(58) Field of Classification Search .......... 361/18, 361/82, 84, 56, 91.1, 111, 91.52, 91.5; 323/272, 323/273, 274, 282
See application file for complete search history.

(56) References Cited

U.S. PATENT DOCUMENTS

| | | | | |
|---|---|---|---|---|
| 4,008,418 A | * | 2/1977 | Murphy | ............... 361/18 |
| 4,186,418 A | * | 1/1980 | Seiler | ............... 361/91.6 |
| 5,771,140 A | | 6/1998 | Kim | |
| 6,154,082 A | | 11/2000 | Bernard et al. | |
| 7,312,967 B2 | * | 12/2007 | Niiyama et al. | ............... 361/91.1 |
| 2004/0150930 A1 | | 8/2004 | Niiyama et al. | |

FOREIGN PATENT DOCUMENTS

| | | |
|---|---|---|
| CN | 1521913 | 8/2004 |
| DE | 196 05 628 C1 | 5/1997 |
| FR | 2 782 581 | 2/2000 |
| JP | 7-147727 | 6/1995 |
| JP | 10-074114 | 3/1998 |
| JP | 200-112542 | 4/2000 |
| JP | 2000-322136 | 11/2000 |
| JP | 2001-337729 A | 12/2001 |
| JP | 2004-208449 | 7/2004 |
| JP | 56-156110 | 3/2005 |
| JP | 2005-083221 | 3/2005 |
| WO | WO02/29950 | 4/2002 |

* cited by examiner

*Primary Examiner*—Stephen W Jackson
*Assistant Examiner*—Terrence R Willoughby
(74) *Attorney, Agent, or Firm*—Mattingly & Malur, PC

(57) ABSTRACT

An IC power protection circuit functions as a surge protection circuit and reverse connection protection circuit. The IC power protection circuit includes an error amplification circuit, positioned and integrated within an integrated circuit and a transistor positioned as a stand-alone element that is separate from the integrated circuit. The integrated circuit includes a sensor signal processing circuit that processes a signal of a sensor. A transistor protects the integrated circuit against a surge voltage from a battery terminal. A resistor is positioned between an output terminal of an error amplifier and a base terminal of the transistor to provide reverse connection protection. Another resistor is connected between a ground and a connection point between the above resistor and the output terminal to provide overvoltage protection for the integrated circuit. A starting resistor is connected between a collector and base of the transistor.

12 Claims, 3 Drawing Sheets

IC POWER PROTECTION CIRCUIT

BACKGROUND OF THE INVENTION

1. Field of the Invention

The present invention relates to a power supply circuit, and more particularly to an IC power protection circuit that supplies power to an integrated circuit whose withstand voltage is lower than a supply voltage supplied from the outside.

2. Description of the Related Art

As a power supply circuit for an integrated circuit, JP-A-2005-83221 describes a power supply circuit for a vehicle-mounted electronic control apparatus. The power supply circuit described in JP-A-2005-83221 enables a control power supply for the vehicle-mounted electronic control apparatus while a power switch is off.

Some power supply circuits, including the power supply circuit described in JP-A-2005-83221, receive power supplied from a battery and supply the received power to a CPU (an integrated circuit whose withstand voltage is lower than a supply voltage that is supplied from the outside) via a constant-voltage power supply circuit (regulator).

SUMMARY OF THE INVENTION

When a highly integrated circuit is to be mounted in a vehicle for use, the battery voltage of the vehicle is often higher than the withstand voltage of the integrated circuit. For example, the battery voltage for automobiles is 12 V or 24 V in most cases, whereas the withstand voltages of highly integrated circuits are not higher than 7 V.

Under the above circumstances, a regulator or like device has been used to reduce the battery voltage to a voltage at which the integrated circuits operate.

However, it is demanded that electronic devices used in a vehicle have, for instance, surge resistance (to keep them from breaking down even when a battery voltage surges) and reverse connection resistance (to keep them from breaking down even when battery terminal connections are reversed).

Since a reference voltage source, error amplifier, and other devices are integrated into the regulator, the withstand voltage is limited to 40 V or so. When it is considered that the surge resistance and reverse connection resistance need to be greater than 40 V, a surge protection circuit and reverse connection protection circuit need to be positioned before the regulator.

As such being the case, when a conventional technology is used, the cost of an IC power protection circuit is raised by the cost of the surge protection circuit and reverse connection protection circuit.

The present invention provides an IC power protection circuit the cost of which can be reduced while offering the same functions as the surge protection circuit and reverse connection protection circuit.

The IC power protection circuit according to an embodiment of the present invention is a protective circuit for supplying power to an integrated circuit whose withstand voltage is lower than a supply voltage that is supplied from the outside.

The IC power protection circuit according to an embodiment of the present invention comprises an error amplification circuit that is positioned in an integrated manner within an integrated circuit, and includes a voltage division section for dividing a voltage applied to a power supply terminal of the integrated circuit and an error amplifier for amplifying a difference between an output from the voltage division section and a reference voltage; a voltage control transistor that conducts depending on an output from the error amplifier, adjusts a voltage supplied from an external power source, and supplies the adjusted voltage to the integrated circuit; and an output terminal protection voltage limiting section that limits the voltage applied to an output terminal of the error amplifier to a voltage not higher than the withstand voltage of the integrated circuit.

According to an embodiment of the present invention, the error amplifier, which is an element of the regulator and positioned in an integrated manner within the integrated circuit to be protected, and the voltage control transistor, which is also an element of the regulator, are furnished as stand-alone elements to provide a high withstand voltage.

As a result, it is possible to provide an IC power protection circuit the cost of which can be reduced while offering the same functions as the surge protection circuit and reverse connection protection circuit.

Thus, the present invention provides an IC power protection circuit the cost of which can be reduced while offering the same functions as the surge protection circuit and reverse connection protection circuit.

Consequently, it is possible to provide a highly reliable IC power protection circuit that can be used in a vehicle-mounted electronic device.

DETAILED DESCRIPTION OF THE PREFERRED EMBODIMENTS

Embodiments of the present invention will now be described with reference to the accompanying drawings.

First of all, an IC power protection circuit according to a first embodiment of the present invention will be described below with reference to FIG. 1.

Figure 1:
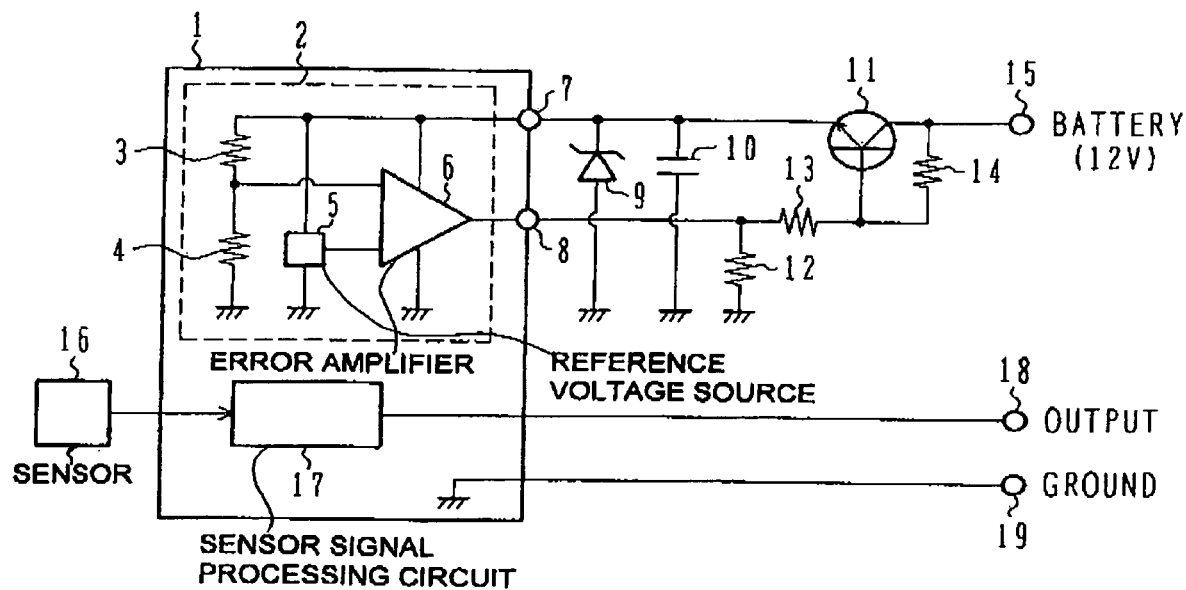
FIG. 1 illustrates the configuration of an IC power protection circuit according to a first embodiment of the present invention.

Referring to FIG. 1, an error amplification circuit 2, which is a part of the IC power protection circuit, is positioned within an integrated circuit 1 and integrated. The integrated circuit 1 includes a sensor signal processing circuit 17 that processes a signal output from a sensor 16 and outputs the processed sensor output to an output terminal 18.

The IC power protection circuit includes a zener diode 9, which is connected to a power supply terminal 7 of the integrated circuit 1 to prevent an overvoltage from being applied to the power supply terminal 7, a capacitor 10, which is connected to the power supply terminal 7 to reduce the power supply impedance of the integrated circuit 1, a battery terminal 15, which receives power from a battery, a ground terminal 19; and a transistor 11, which controls a voltage that is supplied from the battery terminal 15. A collector of the transistor 11 is connected to the battery terminal 15 and an emitter of the transistor 11 is connected to the capacitor 10.

The IC power protection circuit also includes three resistors 12, 13, 14 so that a base voltage of the transistor 11 can be controlled by the error amplification circuit 2. The resistor 14 is connected between the collector and base of the transistor 11. The resistor 13 is connected between the base of the transistor 11 and an output terminal of the integrated circuit 1. The resistor 12 is connected between the ground and a connection point between the resistor 13 and an output terminal 8.

The error amplification circuit 2, which is positioned within the integrated circuit 1, is a voltage division section for dividing the supply voltage applied to the power supply terminal 7 of the integrated circuit 1. It includes resistors 3, 4, which are connected between the power supply terminal 7 and the ground; a reference voltage source 5, which generates a reference voltage; and an error amplifier 6, which amplifies an output difference between the reference voltage source 5 and voltage division section and outputs the amplified output difference to the output terminal 8.

A connection point between the resistors 3, 4 is connected to one input terminal of the error amplifier 6, and the reference voltage source 5 is connected to the other input terminal of the error amplifier 6. An output signal generated from the error amplifier 6 is used to control the transistor to determine whether the transistor is conducting or not so that the voltage supplied from the battery terminal 15 is adjusted and supplied to the integrated circuit 1.

The power for the reference voltage source 5 and error amplifier 6 is supplied from a power source that supplies power to the integrated circuit 1.

In the IC power protection circuit according to the first embodiment of the present invention, the reference voltage source 5 and error amplifier 6, which are included in the IC power protection circuit, are positioned in an integrated manner within the integrated circuit 1, and the transistor 11, which is also included in the IC power protection circuit, is furnished as an element that is separate from the integrated circuit 1. This feature provides the following advantages.

A first advantage of the first embodiment is that the withstand voltage of the transistor 11 can easily be set to a voltage of 90 V or higher because the transistor 11 is a stand-alone element. Thus, the transistor 11 can provide surge protection for the battery terminal 15, which is required for a vehicle-mounted electronic device. Consequently, no additional surge protection circuit is needed.

If a conventional regulator is used, the withstand voltage of the regulator is limited to 40 V or so because the reference voltage source 5 and error amplifier 6 are also integrated within the regulator. Therefore, if a Class A surge (a battery surge having a voltage of 70 V) is applied to the regulator, the regulator breaks down.

In the above case, the use of an additional surge protection circuit is required. If the withstand voltage of the regulator is set to a voltage of 70 V without integrating the regulator, the cost increases considerably.

A second advantage of the first embodiment is that the transistor 11 can provide reverse connection protection because it is a stand-alone element. Thus, no additional reverse connection protection circuit is needed.

If a conventional regulator is used, it is configured as an integrated circuit because it includes the reference voltage source 5 and error amplifier 6. Therefore, if a reverse voltage is applied to a regulator power source, the regulator breaks down. Thus, it is necessary to furnish a reverse connection protection circuit.

A third advantage of the first embodiment is that the number of parts can be reduced by integrating the reference voltage source 5 and error amplifier 6, for instance, within the integrated circuit 1, which includes the sensor signal processing circuit 17. The reference voltage source 5 and error amplifier 6 can be integrated within an integrated circuit having a low withstand voltage. The size is decreased particularly through miniaturization for integration purposes. Therefore, integration within a miniaturizable, low-withstand-voltage integrated circuit is more advantageous than integration within a regulator that requires a high withstand voltage.

To provide the above advantage, a power source for the integrated circuit 1 supplies power to the reference voltage source 5 and error amplifier 6.

However, integrating the error amplifier 6 within a low-withstand-voltage integrated circuit 1 gives rise to some problems.

A first problem relates to reverse connection protection. More specifically, it is demanded that no breakdown occur even when a reverse battery connection is made. In the first embodiment, the power supply terminal 7 of the integrated circuit 1 is protected by the transistor 11. However, if the output terminal 8 of the error amplifier 6 is directly connected to the base terminal of the transistor 11, an overcurrent flows. To avoid such a problem, the first embodiment positions the resistor 13 between the output terminal 8 of the error amplifier 6 and the base terminal of the transistor 11 and uses it as a reverse connection protection resistor.

A second problem relates to surge protection. In the first embodiment, the power supply terminal 7 of the integrated circuit 1 is protected by the transistor 11. However, if the output terminal 8 of the error amplifier 6 is directly connected to the base terminal of transistor 11, an overcurrent flows. To avoid such a problem, the first embodiment sets up the resistors 12 and 13 as overvoltage application prevention resistors.

The overvoltage application prevention resistors 12, 13 avoid the application of an overvoltage to the output terminal 8 of the error amplifier 6 by resistively dividing the surge voltage applied to the battery terminal 15.

A third problem relates to startup reliability. If, in the first embodiment, the transistor 11 is off and unable to supply power to the integrated circuit 1 when the voltage at the battery terminal 15 changes from 0 V to 14 V, the error amplifier 6 to which power is supplied from a power source for the integrated circuit 1 may become inoperative, leaving the transistor 11 off.

The resistor 14 is positioned as a starting resistor between the base and collector of the transistor 11 to avoid the above problem. Even if the output generated from the error amplifier 6 is zero (0) in a situation where the starting resistor 14 is furnished as described above, a certain supply voltage can be applied to the integrated circuit 1 by turning on the transistor 11. Stable startup is assured by designing the reference voltage source 5 and error amplifier 6 so that they operate on such a supply voltage.

As described above, the first embodiment of the present invention provides a high withstand voltage by positioning the error amplifier 6, which is included in the regulator, and the reference voltage source 5 for the error amplifier 6 in an integrated manner within the integrated circuit 1 to be protected, and by furnishing the voltage control transistor 11, which is included in the regulator, as a stand-alone element.

Consequently, the present invention provides an IC power protection circuit the cost of which can be reduced while offering the same functions as the surge protection circuit and reverse connection protection circuit.

Figure 2:
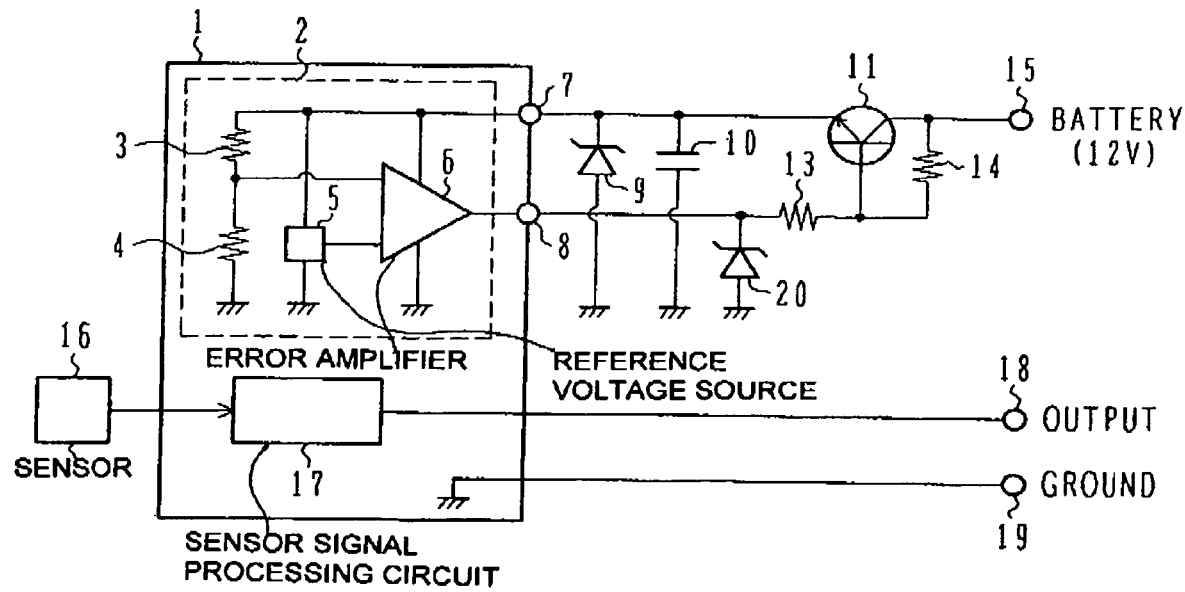
FIG. 2 illustrates the configuration of an IC power protection circuit according to a second embodiment of the present invention.

An IC power protection circuit according to a second embodiment of the present invention will now be described with reference to FIG. 2.

The IC power protection circuit according to the second embodiment is obtained by replacing the overvoltage application prevention resistor 12 according to the first embodiment with a zener diode 20.

The second embodiment of the present invention provides the same advantages as the first embodiment. Further, the second embodiment uses the zener diode 20 to provide battery surge protection for the output terminal 8 of the error amplifier 6. This makes it possible to provide protection against a higher surge voltage.

An IC power protection circuit according to a third embodiment of the present invention will now be described with reference to FIG. 3.

Figure 3:
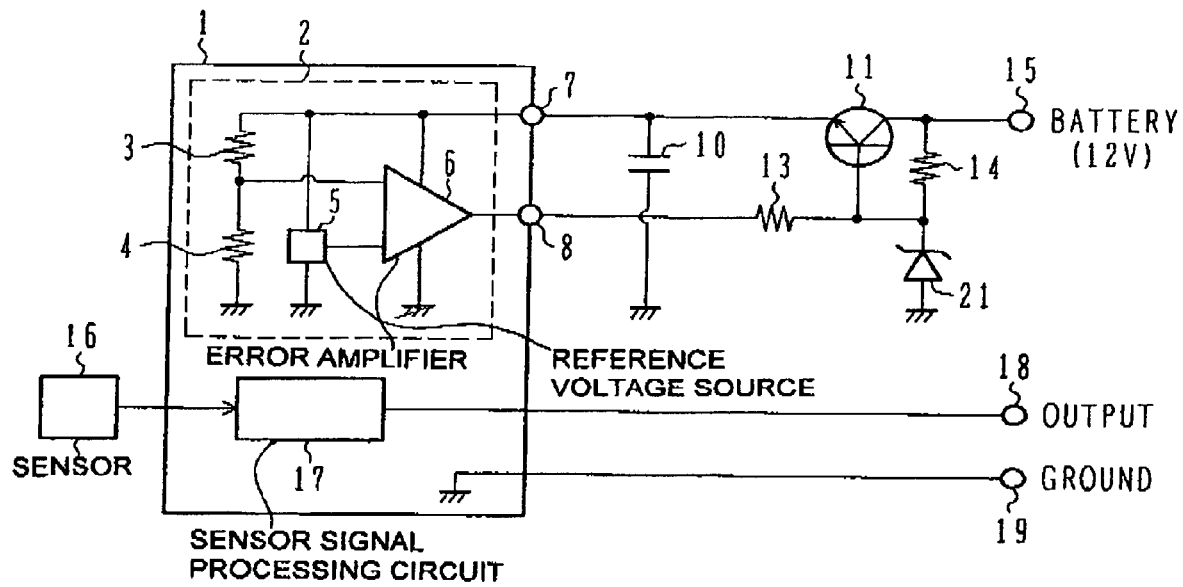
FIG. 3 illustrates the configuration of an IC power protection circuit according to a third embodiment of the present invention.

Referring to FIG. 3, the IC power protection circuit according to the third embodiment is obtained by allowing a zener diode 21, which is connected between the base of the transistor 11 and the ground, to perform the functions of the zener diode 9 and resistor 12 in the first embodiment, and removing the zener diode 9 and resistor 12 from the configuration.

The third embodiment provides the same advantages as the first embodiment. However, the zener diode 21 provides overvoltage protection for the power source of the integrated circuit 1 and for the output terminal of the error amplifier 6. This makes it possible to reduce the number of parts.

In the third embodiment, the zener diode 21 limits the base voltage of the transistor 11 to limit the emitter voltage of the transistor 11, thereby providing overvoltage protection for the integrated circuit 1.

The zener diode 21 also provides overvoltage protection for the output terminal 8 of the error amplifier 6 by limiting the voltage.

Figure 4:
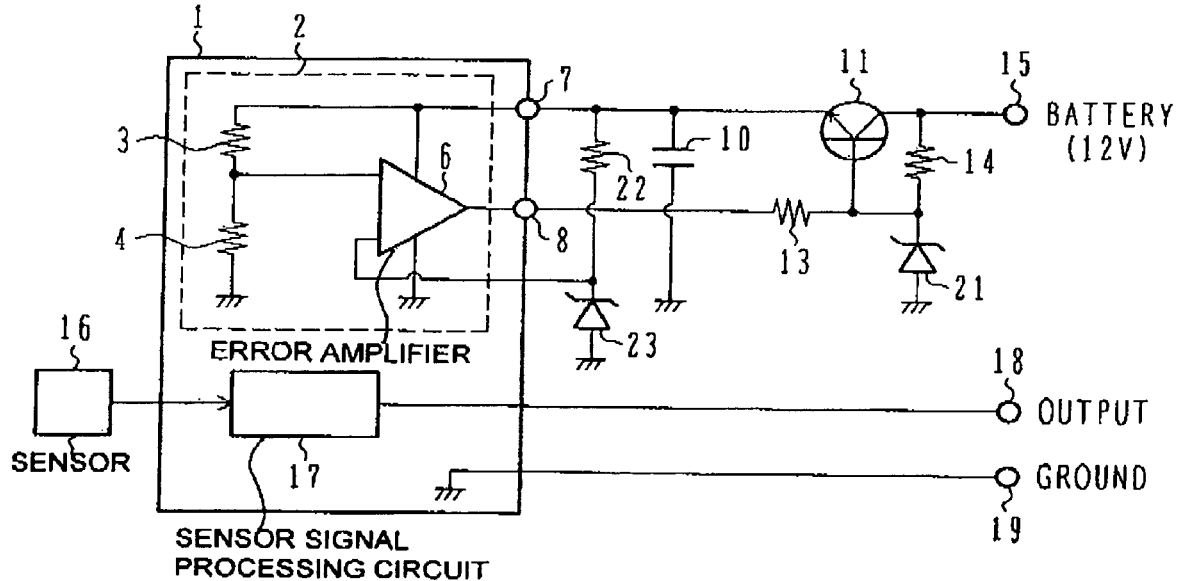
FIG. 4 illustrates the configuration of an IC power protection circuit according to a fourth embodiment of the present invention.

An IC power protection circuit according to a fourth embodiment of the present invention will now be described with reference to FIG. 4.

The IC power protection circuit according to the fourth embodiment is obtained by replacing the reference voltage source 5 in the error amplification circuit 2 for the integrated circuit according to the third embodiment with a resistor 22 and zener diode 23 that are positioned outside the integrated circuit 1.

More specifically, the resistor 22 and zener diode 23 are serially connected between the power supply terminal 7 and the ground. A connection point between the resistor 22 and zener diode 23 is connected to an input terminal of the error amplifier 6. The reference voltage source 5 is removed from the configuration.

The fourth embodiment provides the same advantages as the first embodiment. In the fourth embodiment, the reference voltage source 5 is replaced with external elements so that the present invention can be implemented even when the integrated circuit 1 is a CMOS LSI.

The CMOS LSI can be miniaturized to a great extent; however, it is difficult to integrate the reference voltage source 5. Therefore the reference voltage source is composed of external elements (resistor 22 and zener diode 23).

Figure 5:
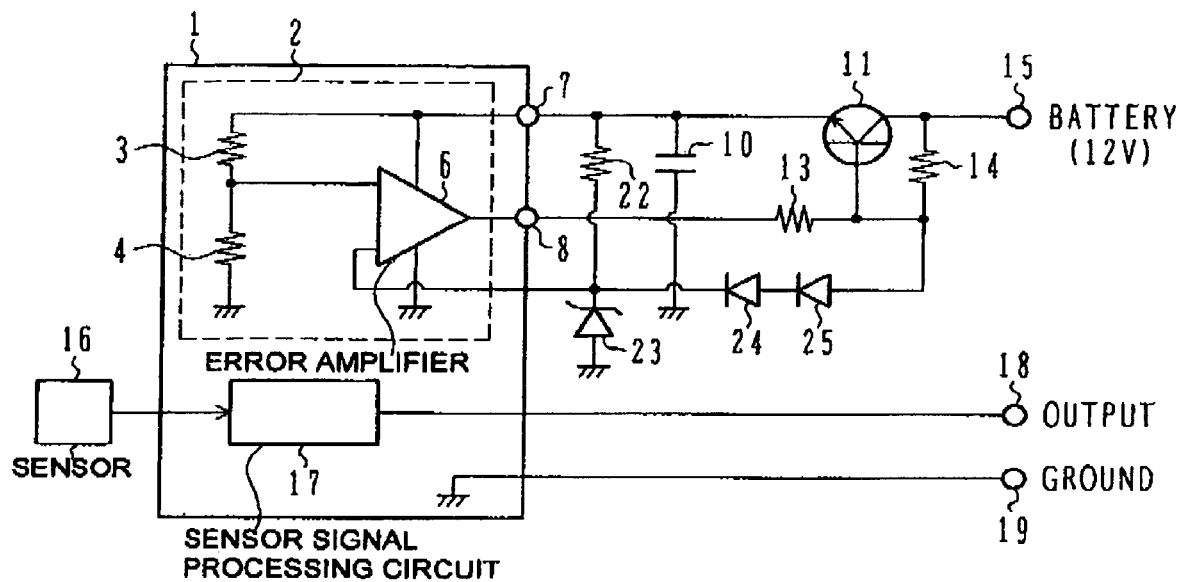
FIG. 5 illustrates the configuration of an IC power protection circuit according to a fifth embodiment of the present invention.

An IC power protection circuit according to a fifth embodiment of the present invention will now be described with reference to FIG. 5.

The IC power protection circuit according to the fifth embodiment is obtained by replacing the zener diode 21 in the fourth embodiment with diodes 24, 25 and zener diode 23 (the zener diode 23 doubles as a reference voltage source).

More specifically, an anode of the diode 25 is connected to a connection point between the resistor 14 and the base of the transistor 11, and a cathode of the diode 25 is connected to an anode of the diode 24.

A cathode of the diode 24 is connected to a cathode of the zener diode 23, and an anode of the zener diode 23 is connected to the ground.

In the fifth embodiment, the zener diode 23, which is used for reference voltage generation, and the diodes 24, 25 are used to limit the base voltage of the transistor 11. This provides overvoltage protection for the power supply terminal 7 of the integrated circuit 1 and for the output terminal 8 of the error amplifier 6.

The fifth embodiment provides the same advantages as the fourth embodiment. In addition, the cost of parts can be reduced because the zener diode 21 in the fourth embodiment is replaced with the diodes 24, 25.

Figure 6:
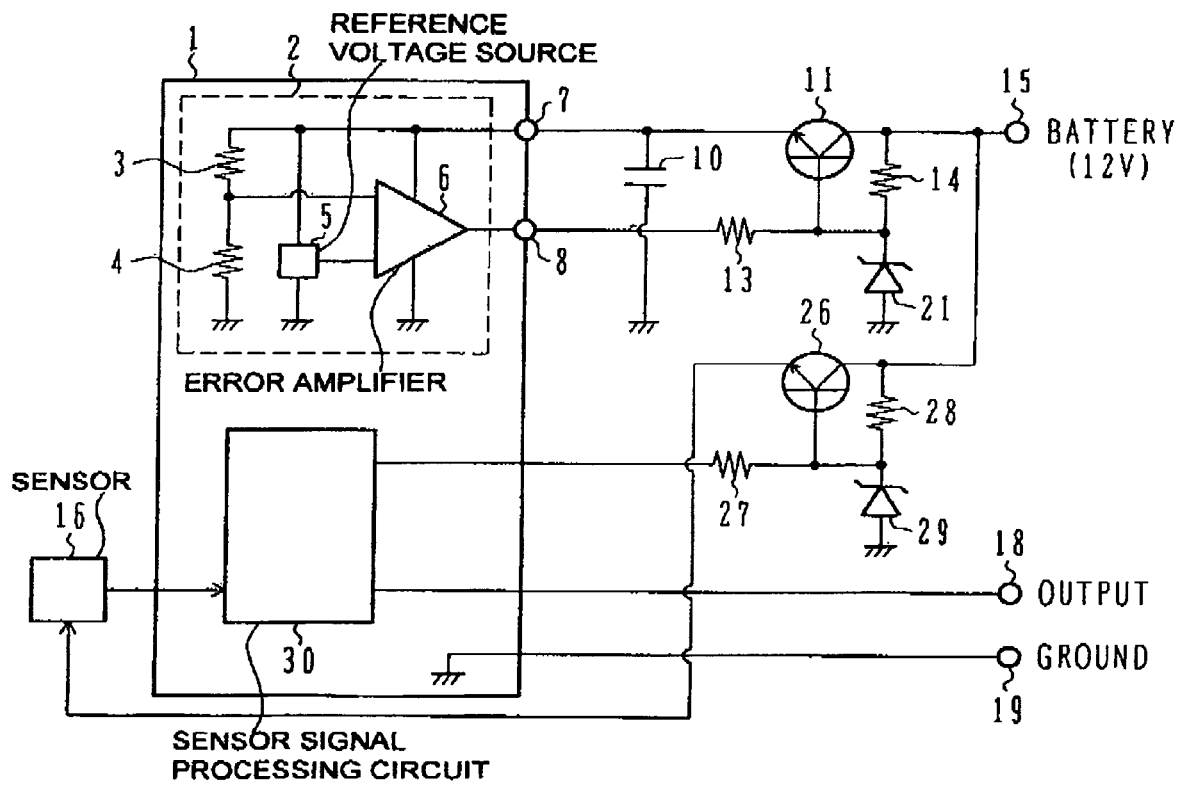
FIG. 6 illustrates the configuration of an IC power protection circuit according to a sixth embodiment of the present invention.

An IC power protection circuit according to a sixth embodiment of the present invention will now be described with reference to FIG. 6.

The IC power protection circuit according to the sixth embodiment has the same basic configuration as the power supply circuit for the integrated circuit in the third embodiment except that an external sensor voltage supply section is added. The external sensor voltage supply section includes a transistor 26, resistors 27, 28, and a zener diode 29.

More specifically, the battery terminal 15 is connected to the sensor 16 via a collector and emitter of the transistor 26. The collector of the transistor 26 is connected to the ground via the resistor 28 and zener diode 29. A connection point between the resistor 28 and zener diode 29 is connected not only to a base of the transistor 26 but also to a sensor signal processing circuit 30 via the resistor 27.

Since the employed configuration is as described above, the sensor signal processing circuit 30 can cause the battery terminal 15 to apply a voltage to the sensor 16. The voltage applied to the sensor 16 can be higher than the withstand voltage of the integrated circuit 1.

In other words, the sensor signal processing circuit 30 can control the transistor 26 so that a voltage is directly supplied from the battery terminal 15 to an airflow sensor or other sensor 16 that requires a high voltage and large current.

As is the case with the output terminal 8 of the error amplifier 6, which was explained earlier, the resistor 27 and zener diode 29 provide overvoltage protection and reverse connection protection for a voltage output terminal (the output terminal of the integrated circuit 1) that delivers an output to the base of the transistor 26 from the sensor signal processing circuit 30 for control purposes.

The sixth embodiment provides the same advantages as the third embodiment. In addition, the sensor signal processing circuit 30 can control the transistor 26, as described earlier, so that a voltage is directly supplied from the battery terminal 15 to the sensor 16.

The sixth embodiment assumes that the reference voltage source 5 is positioned inside the integrated circuit 1, and allows the sensor signal processing circuit 30 to control the transistor 26 so that a voltage is directly supplied from the battery terminal 15 to the sensor 16. However, the present invention can also be applied to a case where the reference voltage source 5 is positioned outside the integrated circuit 1 as indicated by the examples shown in FIGS. 4 and 5.

What is claimed is:

1. An IC power protection circuit which supplies power to an integrated circuit whose withstand voltage is lower than a supply voltage supplied from the outside, the IC power protection circuit comprising:

an error amplification circuit which is positioned in an integrated manner within the integrated circuit, and includes a voltage division section for dividing a voltage applied to a power supply terminal of the integrated circuit and an error amplifier for amplifying a difference between an output from the voltage division section and a reference voltage;

a voltage control transistor which conducts depending on an output from the error amplifier, adjusts a voltage supplied from an external power source, and supplies the adjusted voltage to the integrated circuit; and an output terminal protection voltage limiting section which limits the voltage applied to an output terminal of the error amplifier to a voltage not higher than the withstand voltage of the integrated circuit;

wherein a power source of the error amplification circuit is a voltage adjusted by the voltage control transistor.

2. The IC power protection circuit according to claim 1, wherein a reference voltage source generating the reference voltage is positioned in an integrated manner within the integrated circuit.

3. The IC power protection circuit according to claim 1, wherein said output terminal protection voltage limiting section is composed of a plurality of resistive elements.

4. The IC power protection circuit according to claim 1, wherein said output terminal protection voltage limiting section is a zener diode.

5. The IC power protection circuit according to claim 1, further comprising an input terminal protection voltage limiting section which limits the voltage applied to an input terminal of the integrated circuit to a voltage not higher than the withstand voltage of the integrated circuit.

6. The IC power protection circuit according to claim 1, further comprising a base voltage limiting section which limits the voltage applied to a base terminal of said voltage control transistor to a voltage not higher than the withstand voltage of the integrated circuit.

7. The IC power protection circuit according to claim 5, wherein said input terminal protection voltage limiting section is a zener diode.

8. The IC power protection circuit according to claim 1, wherein a sensor signal processing circuit is integrated within the integrated circuit to receive a signal supplied from an external sensor, process the received signal, and transfers the processed signal out of the integrated circuit.

9. An IC power protection circuit which supplies power to an integrated circuit whose withstand voltage is lower than a supply voltage supplied from the outside, the IC power protection circuit comprising:

an error amplification circuit which is positioned in an integrated manner within the integrated circuit, and includes a voltage division section for dividing a voltage applied to a power supply terminal of the integrated circuit and an error amplifier for amplifying a difference between an output from the voltage division section and a reference voltage;

a voltage control transistor which conducts depending on an output from the error amplifier, adjusts a voltage supplied from an external power source, and supplies the adjusted voltage to the integrated circuit; and an output terminal protection voltage limiting section which limits the voltage applied to an output terminal of the error amplifier to a voltage not higher than the withstand voltage of the integrated circuit;

wherein a sensor signal processing circuit is integrated within the integrated circuit to receive a signal supplied from an external sensor, process the received signal and transfers the processed signal out of the integrated circuit;

further comprising an external sensor voltage supply section which controls a supply voltage supplied from an outside of said integrated circuit in accordance with a control signal from the sensor signal processing circuit and supplies the controlled supply voltage to the external sensor.

10. The IC power protection circuit according to claim 1, wherein a starting resistor is connected between a collector and a base of said voltage control transistor.

11. An IC power protection circuit which supplies power to an integrated circuit whose withstand voltage is lower than a supply voltage supplied from the outside, the IC power protection circuit comprising:

an error amplification circuit which is positioned in an integrated manner within the integrated circuit, and includes a voltage division section for dividing a voltage applied to a power supply terminal of the integrated circuit and an error amplifier for amplifying a difference between an output from the voltage division section and a reference voltage;

a voltage control transistor which conducts depending on an output from the error amplifier, adjusts a voltage supplied from an external power source, and supplies the adjusted voltage to the integrated circuit;

an output terminal protection voltage limiting section which limits the voltage applied to an output terminal of the error amplifier to a voltage not higher than the withstand voltage of the integrated circuit; and wherein a reference voltage source generating the reference voltage is positioned outside the integrated circuit.

12. The IC power protection circuit according to claim 11, wherein the reference voltage source generating the reference voltage is composed of a resistor which is connected to the power supply terminal of the integrated circuit and a zener diode which is connected in series with the resistor.

* * * * *